United States Patent
Nakamura et al.

(10) Patent No.: US 9,257,678 B2
(45) Date of Patent: Feb. 9, 2016

(54) ORGANIC LUMINESCENT DISPLAY DEVICE

(71) Applicant: Japan Display Inc., Tokyo (JP)

(72) Inventors: Tomoki Nakamura, Tokyo (JP); Yasuyuki Yamada, Tokyo (JP); Tohru Sasaki, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/057,043

(22) Filed: Oct. 18, 2013

(65) Prior Publication Data

US 2014/0110688 A1   Apr. 24, 2014

(30) Foreign Application Priority Data

Oct. 24, 2012  (JP) .................................. 2012-234968

(51) Int. Cl.
   *H01L 51/52* (2006.01)
(52) U.S. Cl.
   CPC ........ *H01L 51/5284* (2013.01); *H01L 51/5253* (2013.01)
(58) Field of Classification Search
   USPC ........... 257/79–103, 57, 59, 66, 72, 359, 390, 257/443, E21.411, E21.412, E21.024, 257/E51.005, E29.151, E27.1, E29.117, 257/149, 158–159; 438/30, 149, 158–159
   See application file for complete search history.

(56) References Cited

U.S. PATENT DOCUMENTS

2005/0189874 A1* 9/2005 Park et al. ..................... 313/504
2007/0200492 A1* 8/2007 Cok ...................... H01L 27/322
                                                           313/506

FOREIGN PATENT DOCUMENTS

JP   2002-252082   9/2002

* cited by examiner

*Primary Examiner* — Fernando L Toledo
*Assistant Examiner* — Lawrence-Linh T Nguyen
(74) *Attorney, Agent, or Firm* — Lowe Hauptman & Ham, LLP

(57) ABSTRACT

An organic electroluminescent display device of the invention includes an element substrate, an organic electroluminescent light-emitting element disposed on the element substrate, and a sealing film disposed on the organic electroluminescent light-emitting element, wherein the organic electroluminescent light-emitting element includes an anode formed of metal and disposed on the element substrate, a light-emitting layer disposed on the anode, and a transparent cathode disposed on the light-emitting layer, and the sealing film includes a light-transmittance-reducing layer colored in black.

9 Claims, 4 Drawing Sheets

ORGANIC LUMINESCENT DISPLAY DEVICE

CROSS-REFERENCE TO RELATED APPLICATION

The present application claims priority from Japanese application JP 2012-234968 filed on Oct. 24, 2012, the content of which is hereby incorporated by reference into this application.

BACKGROUND OF THE INVENTION

1. Field of the Invention

The present invention relates to an organic electroluminescent display device.

2. Description of the Related Art

As a thin and lightweight light-emitting source, an organic light-emitting diode, that is, an organic electroluminescent light-emitting element is attracting attention, and an image display device including a number of organic electroluminescent light-emitting elements has been developed. The organic electroluminescent light-emitting element has a structure in which at least one layer of organic thin film formed of an organic material is interposed between a pixel electrode and a counter electrode. In recent years, the thinning and higher luminance of such an organic electroluminescent display device are demanded.

As an organic electroluminescent display device including an organic electroluminescent light-emitting element, a configuration including, for example, an element substrate, an organic electroluminescent light-emitting element, and a transparent sealing film covering the organic electroluminescent light-emitting element has been known, in which the organic electroluminescent light-emitting element includes an anode (pixel electrode) formed of metal, an organic thin film including a light-emitting layer, and a transparent cathode (counter electrode). JP 2002-252082 A discloses a configuration having a polarizer arranged on a sealing film, or a configuration having an antireflection film disposed on a sealing film.

SUMMARY OF THE INVENTION

In an organic electroluminescent display device in which a transparent sealing film is disposed on an organic electroluminescent light-emitting element, light incident on the sealing film from the outside of the organic electroluminescent display device is reflected by an anode (reflection film) of the organic electroluminescent light-emitting element, which affects the image quality of an image displayed on the organic electroluminescent display device. When a polarizer or antireflection film is arranged on the sealing film for suppressing the incidence of light on the sealing film, the thickness of the organic electroluminescent display device is increased correspondingly to the amount of the polarizer or antireflection film. Further, because of such a configuration, light emitted from the organic electroluminescent light-emitting element is not transmitted out of the organic electroluminescent display device due to the polarizer or antireflection film, so that the light emission luminance of the organic electroluminescent display device is reduced.

The invention has been made in view of the circumstances described above, and it is an object of the invention to provide an organic electroluminescent display device capable of realizing thinning and higher luminance while suppressing the reflection of light incident from the outside of the organic electroluminescent display device.

(1) An organic electroluminescent display device according to an aspect of the invention includes: an element substrate; an organic electroluminescent light-emitting element disposed on the element substrate; and a sealing film disposed on the organic electroluminescent light-emitting element, wherein the organic electroluminescent light-emitting element includes an anode formed of metal and disposed on the element substrate, a light-emitting layer disposed on the anode, and a transparent cathode disposed on the light-emitting layer, and the sealing film includes a light-transmittance-reducing layer colored in black.

(2) In the organic electroluminescent display device according to (1), an upper surface of the sealing film may be covered with an antireflection film.

(3) In the organic electroluminescent display device according to (1) or (2), the antireflection film may be a single-layer film.

(4) In the organic electroluminescent display device according to (1) or (2), the antireflection film may be a multi-layer film.

(5) In the organic electroluminescent display device according to any one of (1) to (4), the sealing film may include a first sealing layer covering a lower surface of the light-transmittance-reducing layer, and a second sealing layer covering an upper surface of the light-transmittance-reducing layer.

(6) In the organic electroluminescent display device according to any one of (1) to (5), the sealing film may contain silicon nitride.

(7) In the organic electroluminescent display device according to anyone of (1) to (6), the light-transmittance-reducing layer may contain chromium.

(8) In the organic electroluminescent display device according to (7), the light-transmittance-reducing layer may further contain chromium oxide.

DETAILED DESCRIPTION OF THE INVENTION

Figure 1:
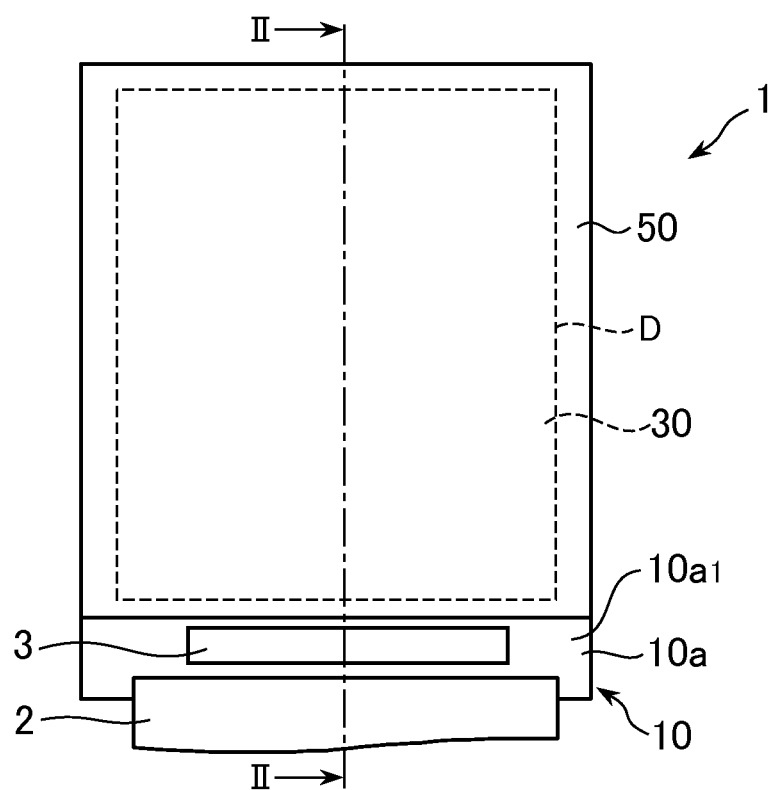
FIG. 1 is a schematic plan view of an organic electroluminescent display device according to an embodiment of the invention.

Hereinafter, an embodiment of the invention will be described based on the drawings. In components appearing in the specification, components having the same function are denoted by the same reference numeral and sign, and the description thereof is omitted. In the drawings referred to in the following description, a portion having a feature is sometimes shown in an enlarged manner for convenience sake to facilitate the understanding of the feature. Therefore, the dimension ratio or the like of each component is not always the same as a real one. Moreover, materials or the like illustrated in the following description are illustrative only. Each component maybe different from the illustrated one and can be implemented by modification within a range not changing the gist thereof.

Figure 2:
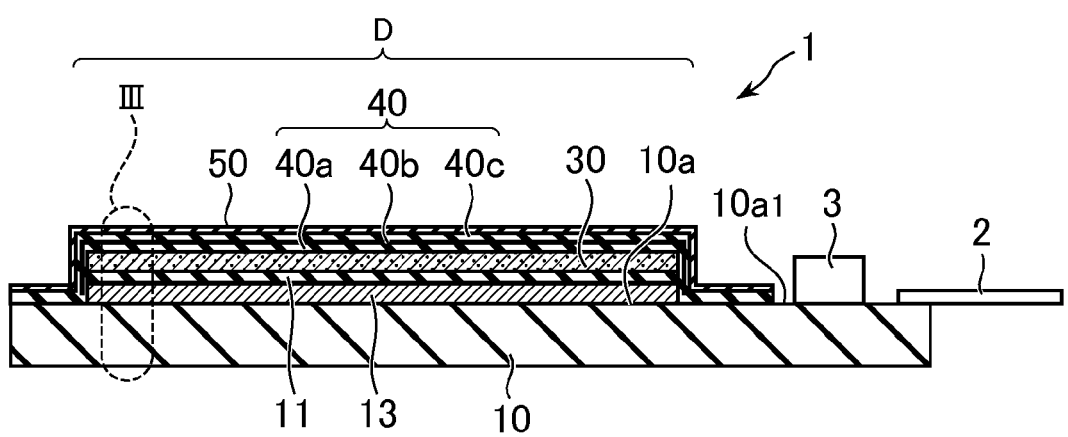
FIG. 2 is a schematic cross-sectional view of the organic electroluminescent display device shown in FIG. 1, taken along a cutting-plane line II-II.

First, an organic electroluminescent display device 1 according to the embodiment of the invention will be described. FIG. 1 is a schematic plan view of the organic electroluminescent display device 1 according to the embodiment of the invention. FIG. 2 is a schematic cross-sectional view of the organic electroluminescent display device 1 shown in FIG. 1, taken along a cutting-plane line II-II. The organic electroluminescent display device 1 according to the embodiment includes an element substrate 10, organic electroluminescent light-emitting elements 30 disposed on the element substrate 10, a sealing film 40 disposed on the organic electroluminescent light-emitting elements 30 and including, for example, a first sealing layer 40a, a light-transmittance-reducing layer 40b, and a second sealing layer 40c, and an antireflection film 50.

The element substrate 10 is, for example, a rectangular substrate (hereinafter referred to as low-temperature polysilicon substrate) formed with a low-temperature polysilicon layer, on an upper surface 10a of which the plurality of organic electroluminescent light-emitting elements 30 are disposed. The low-temperature polysilicon as used herein means polysilicon formed under the condition of 600° C. or less. A portion of the upper surface 10a of the element substrate 10 and the organic electroluminescent light-emitting elements 30 are covered with the sealing film 40. The organic electroluminescent light-emitting elements 30 are disposed in a display area D having, for example, a perimeter smaller than that of the element substrate 10 in plan view.

In the upper surface 10a of the element substrate 10, a flexible circuit board 2 is connected to an area $10a_1$ where the organic electroluminescent light-emitting element 30 and the sealing film 40 are not formed. Further, a driving driver 3 is disposed in the area $10a_1$. The driving driver 3 is a driver supplied with image data from the outside of the organic electroluminescent display device 1 via the flexible circuit board 2. With the supply of image data, the driving driver 3 supplies, via data lines (not shown), display data to the organic electroluminescent light-emitting elements 30.

Figure 3:
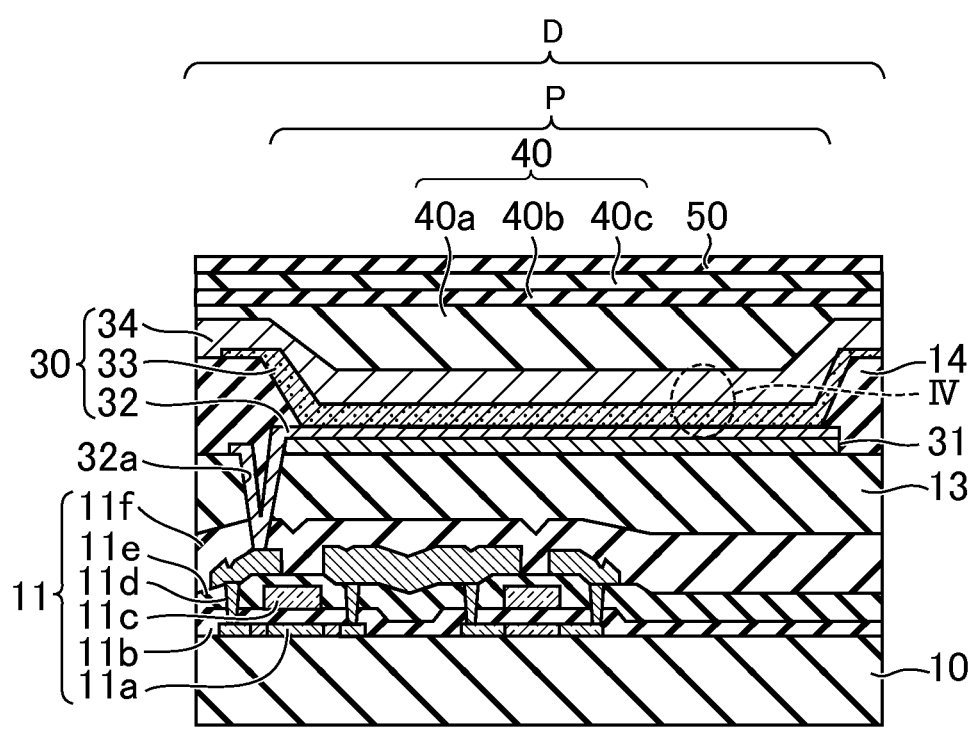
FIG. 3 is a partially enlarged view of an area III of the organic electroluminescent display device shown in FIG. 2.

Next, the configuration of the display area D of the organic electroluminescent display device 1 will be described in detail. FIG. 3 is a partially enlarged view of an area III of the organic electroluminescent display device 1 shown in FIG. 2. The area III is an area corresponding to one pixel P in the display area D. On the element substrate 10 of the area III, a thin film transistor 11, the organic electroluminescent light-emitting element 30, the sealing film 40, and the antireflection film 50 are stacked.

The thin film transistor 11 is a transistor for driving the organic electroluminescent light-emitting element 30 and disposed on the element substrate 10 in each of the pixels P. The thin film transistor 11 is composed of a polysilicon semiconductor layer 11a, a gate insulating layer 11b, a gate line (gate electrode) 11c, a source/drain electrode 11d, a first insulating film 11e, and a second insulating film 11f.

An upper surface of the thin film transistor 11 is covered with a passivation layer 13 formed of an insulator. The passivation layer 13 is formed of, for example, $SiO_2$, SiN, an acrylic resin, polyimide, or the like. Since the passivation layer 13 is disposed on the thin film transistor 11 in this manner, the thin film transistors 11 in the pixels P next to each other, or the thin film transistor 11 and the organic electroluminescent light-emitting element 30 are electrically insulated from each other.

For example, a reflection film 31 may be disposed on the passivation layer 13. The reflection film 31 is disposed for reflecting light that is emitted from the organic electroluminescent light-emitting element 30 to the sealing film 40 side. The material of the reflection film 31 preferably has a higher optical reflectance, and may be a metal film formed of, for example, aluminum, silver, or the like.

The organic electroluminescent light-emitting element 30 is disposed on the reflection film 31. The organic electroluminescent light-emitting element 30 is schematically composed of an anode 32 as an electrode formed of metal and disposed on the element substrate 10 (on the reflection film 31), an organic layer 33 disposed on the anode 32, and a cathode 34 as a transparent electrode disposed on the organic layer 33.

The anodes 32 are arranged in a matrix, each of which corresponds to an area disposed with the pixel P. The anode 32 is formed of a material having translucency and conductivity such as, for example, ITO (Indium Tin Oxide), and formed so as to cover the reflection film 31. When the reflection film 31 is formed of metal such as silver (Ag) and in contact with ITO of the anode, the reflection film 31 also acts as a portion of the anode. The anode 32 is electrically connected to the thin film transistor 11 via a contact hole 32a disposed through the passivation layer 13 and the second insulating film 11f. With the configuration described above, a driving current supplied from the thin film transistor 11 is injected into the organic layer 33 via the anode 32.

Between the anodes 32 next to each other, a bank 14 formed of, for example, an insulator is formed. When the organic layer 33 is formed every pixel P, the bank 14 is preferably disposed so as to surround the perimeter of the anode 32. Since the bank 14 is disposed in this manner, contact between the anodes 32 next to each other is prevented. Moreover, a leakage current between the anode 32 and the cathode 34 is prevented.

Figure 4:
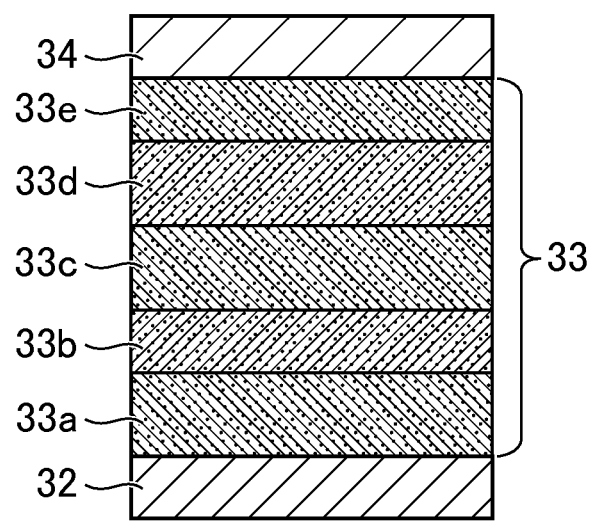
FIG. 4 is a partially enlarged view of an area IV shown in FIG. 3.

FIG. 4 is a partially enlarged view of an area IV shown in FIG. 3. The organic layer 33 is disposed on the anode 32. The organic layer 33 includes, for example, a hole injection layer 33a, a hole transport layer 33b, a light-emitting layer 33c, an electron transport layer 33d, and an electron injection layer 33e stacked in this order from the anode 32 side. The stacked structure of the organic layer 33 is not limited to that mentioned herein. The stacked structure is not specified as long as it includes at least the light-emitting layer 33c.

The hole injection layer 33a and the hole transport layer 33b have a function of transporting holes injected from the anode 32 to the light-emitting layer 33c. The light-emitting layer 33c is composed of, for example, an organic electroluminescent material that emits light in response to the combination of holes and electrons. The organic layer 33 may emit white light or another color light. The electron injection layer 33e and the electron transport layer 33d have a function of transporting electrons injected from the cathode 34 to the light-emitting layer 33c.

As shown in FIG. 3, the cathode 34 is formed so as to cover the organic layer 33 (the light-emitting layer 33c). The cathode 34 is a transparent common electrode commonly contacting the organic layers 33 of the plurality of organic electroluminescent light-emitting elements 30. The cathode 34 is formed of a material having translucency and conductivity such as, for example, ITO.

An upper surface of the cathode 34 is covered with the sealing film 40. The sealing film 40 preferably includes, for example, a silicon nitride (SiN) layer, but may include, for example, a SiO layer, a SiON layer, and a resin layer. Moreover, the sealing film 40 may be a single-layer film or stacked structure formed of these materials.

The sealing film 40 in the embodiment includes the light-transmittance-reducing layer 40b colored in black. The light-transmittance-reducing layer 40b preferably contains silicon nitride, but may contain other materials. The light-transmittance-reducing layer 40b contains chromium as a colorant, thereby being colored in black. The light-transmittance-reducing layer 40b may further contain chromium oxide in addition to chromium. Moreover, the light-transmittance-reducing layer 40b may be a stacked structure composed of a chromium-containing layer and a chromium oxide-containing layer.

The thickness of the light-transmittance-reducing layer 40b may be, for example, from 500 nm to 5 μm, but can be appropriately set according to a light transmittance to be set, the amount of colorant, the entire thickness of the sealing film 40, and the like. It is sufficient that the content or kind of a colorant such as chromium or chromium oxide is appropriately adjusted according to a light transmittance to be set.

The sealing film 40 has, for example, a stacked structure composed of the first sealing layer 40a covering a lower surface of the light-transmittance-reducing layer 40b and having, for example, a thickness of from 100 nm to 1 μm, the light-transmittance-reducing layer 40b, and the second sealing layer 40c covering an upper surface of the light-transmittance-reducing layer 40b and having a thickness of from 100 nm to 1 μm as shown in FIG. 3, but may be a single-layer film composed only of the light-transmittance-reducing layer 40b. The thicknesses of the first sealing layer 40a and the second sealing layer 40c are not limited to the examples mentioned herein, and may be appropriately adjusted according to a desired thickness of the light-transmittance-reducing layer 40b or the entire thickness of the sealing film 40.

The configuration of the sealing film 40 is not limited to that mentioned herein, and may be a plurality of stacked layers different in transmittance or material. The stacked structure composed of the first sealing layer 40a, the light-transmittance-reducing layer 40b, and the second sealing layer 40c may be stacked twice or more in a repetitive manner.

An upper surface of the sealing film 40 may be covered with the antireflection film 50. As the antireflection film 50, a single-layer film formed of, for example, $MgF_2$ and having a thickness of from 50 nm to 150 nm can be used. The antireflection film 50 is not limited to a single-layer film, and may be a multi-layer film formed of different layers such as of metal, metallic oxide, and $SiO_2$. Specifically, for example, a multi-layer film formed of a stacked structure composed of a $SiO_2$ film and a $LaO_3$ film may be used as the antireflection film 50.

The organic electroluminescent display device 1 in the embodiment includes the light-transmittance-reducing layer 40b colored in black in the sealing film 40. Therefore, light incident on the sealing film 40 from the outside of the organic electroluminescent display device 1 is absorbed by the light-transmittance-reducing layer 40b, so that the transmittance of light to the anode 32 is reduced. For this reason, without separately disposing a polarizer on the sealing film 40, it is possible to suppress the reflection of the light incident from the outside of the organic electroluminescent display device 1 by the reflection film 31. Moreover, since there is no need to dispose a polarizer on the sealing film 40, the higher luminance and thinning of the organic electroluminescent display device 1 can be realized.

In the organic electroluminescent display device 1 in the embodiment, the upper surface of the sealing film 40 is covered with the antireflection film 50. Therefore, it is possible to further reduce the transmittance of the light incident on the anode 32 from the outside of the organic electroluminescent display device 1. For this reason, the reflection of the light by the reflection film 31 and a trouble of the organic electroluminescent display device 1 caused by the reflection can be suppressed. Moreover, in the organic electroluminescent display device 1 in the embodiment, the light-transmittance-reducing layer 40b is disposed. Therefore, the reflection by the reflection film 31 can be suppressed even when the thickness of the antireflection film 50 is reduced compared to an organic electroluminescent display device not having this configuration. For this reason, the thinning of the organic electroluminescent display device 1 can be realized.

In the organic electroluminescent display device 1 in the embodiment, the thickness of the antireflection film 50 can be reduced by making the antireflection film 50 into a single-layer film, compared to an organic electroluminescent display device not having this configuration. For this reason, the thinning of the organic electroluminescent display device 1 can be realized.

In the organic electroluminescent display device 1 in the embodiment, light at a wavelength absorbed by the antireflection film 50 can be more finely adjusted by making the antireflection film 50 into a multi-layer film, compared to an organic electroluminescent display device not having this configuration. For this reason, the higher luminance of the organic electroluminescent display device 1 and the prevention of reflection of light can be realized.

The organic electroluminescent display device 1 in the embodiment has the stacked structure composed of the first sealing layer 40a covering the lower surface of the light-transmittance-reducing layer 40b, the light-transmittance-reducing layer 40b, and the second sealing layer 40c covering the upper surface of the light-transmittance-reducing layer 40b. Therefore, the thickness of each of the sealing film 40 and the light-transmittance-reducing layer 40b can be adjusted to any thickness. For this reason, the light transmittance of the light-transmittance-reducing layer 40b is easily set to any value compared to an organic electroluminescent display device not having this configuration. Therefore, the higher luminance of the organic electroluminescent display device 1 and the prevention of reflection can be realized.

In the organic electroluminescent display device 1 in the embodiment, the sealing film 40 contains silicon nitride (SiN). Therefore, it is possible to prevent moisture from penetrating into the organic electroluminescent display device 1 compared to an organic electroluminescent display device not having this configuration. For this reason, in addition to the advantageous effect described above, it is possible to prevent the occurrence of failure of the organic electroluminescent display device 1.

In the organic electroluminescent display device 1 in the embodiment, the light-transmittance-reducing layer 40b contains chromium. Therefore, any light transmittance can be obtained with a small amount of chromium compared to an organic electroluminescent display device not having this configuration. Further, the effect becomes more remarkable by containing chromium oxide in the light-transmittance-reducing layer 40b. For this reason, the thickness of the light-transmittance-reducing layer 40b can be reduced compared to an organic electroluminescent display device not having this configuration. Due to this, the thinning of the organic electroluminescent display device 1 can be realized.

While there have been described what are at present considered to be certain embodiments of the invention, it will be understood that various modifications may be made thereto, and it is intended that the appended claims coverall such modifications as fall within the true spirit and scope of the invention.

What is claimed is:

1. An organic electroluminescent display device comprising:
    an element substrate;

a thin film transistor formed on the element substrate;
an insulation layer formed on the thin film transistor;
a plurality of organic electroluminescent light-emitting elements disposed on the insulation layer;
an insulation bank formed on the insulation layer, the insulation bank including a first bank and a second bank; and
a sealing film disposed on each of the organic electroluminescent light-emitting elements, the first insulation bank, and the second insulation bank,
wherein each of the organic electroluminescent light-emitting elements includes an anode disposed on the element substrate,
an organic layer including a light-emitting layer disposed on the anode, and
a transparent cathode disposed on the organic layer,
wherein each of the organic electroluminescent light-emitting elements is arranged between the first bank and the second bank,
wherein the sealing film includes a light-transmittance-reducing layer colored in black to form a gray filter,
wherein the gray filter is configured to spread continuously from a first region above the first bank to a second region above the second bank through a third region above each of the organic electroluminescent light-emitting elements,
wherein the gray filter covers the plurality of organic electroluminescent light-emitting elements if plan view, and
wherein the gray filter is configured to attenuate light transmitting from each of the organic electroluminescent light-emitting elements while letting the light pass outside of the organic electroluminescent display device.

2. The organic electroluminescent display device according to claim 1, wherein an upper surface of the sealing film is covered with an antireflection film.

3. The organic electroluminescent display device according to claim 2, wherein the antireflection film is comprised of a single-layer film.

4. The organic electroluminescent display device according to claim 2, wherein the antireflection film is comprised of a multi-layer film.

5. The organic electroluminescent display device according to claim 1, wherein the sealing film includes
a first sealing layer covering a lower surface of the light-transmittance-reducing layer, and
a second sealing layer covering an upper surface of the light-transmittance-reducing layer.

6. The organic electroluminescent display device according to claim 1, wherein the sealing film contains silicon nitride.

7. The organic electroluminescent display device according to claim 1, wherein the light-transmittance-reducing layer contains chromium.

8. The organic electroluminescent display device according to claim 7, wherein the light-transmittance-reducing layer further contains chromium oxide.

9. The organic electroluminescent display device according to claim 7, wherein
in each of the organic electroluminescent light-emitting elements, the anode is connected to the organic layer and the organic layer is connected to the transparent cathode, and
outside the organic electroluminescent light-emitting element, the anode and the organic layer is separated by the insulation bank.

* * * * *